US012765231B2

(12) United States Patent
Yang et al.

(10) Patent No.: US 12,765,231 B2
(45) Date of Patent: Oct. 13, 2026

(54) DISPLAY PANEL AND METHOD FOR MANUFACTURING SAME, AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Zongshun Yang, Beijing (CN); Yunhao Zhang, Beijing (CN); Zhongxiang Yu, Beijing (CN); Chao Yang, Beijing (CN); Fushuang Zhang, Beijing (CN); Jianming Zou, Beijing (CN); Dongdong Su, Beijing (CN); Hongtao Yu, Beijing (CN); Kuanta Huang, Beijing (CN); Weiliang Bu, Beijing (CN)

(73) Assignees: YUNNAN INVENSIGHT OPTOELECTRONICS TECHNOLOGY CO., LTD., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 313 days.

(21) Appl. No.: 18/288,822

(22) PCT Filed: Aug. 23, 2022

(86) PCT No.: PCT/CN2022/114347

§ 371 (c)(1),
(2) Date: Oct. 30, 2023

(87) PCT Pub. No.: WO2024/040447

PCT Pub. Date: Feb. 29, 2024

(65) Prior Publication Data

US 2025/0081814 A1 Mar. 6, 2025

(51) Int. Cl.
*H10K 59/80* (2023.01)
*H10K 59/122* (2023.01)
(Continued)

(52) U.S. Cl.
CPC ......... *H10K 59/873* (2023.02); *H10K 59/122* (2023.02); *H10K 59/131* (2023.02); *H10K 59/38* (2023.02); *H10K 59/879* (2023.02)

(58) Field of Classification Search
CPC .. H10K 59/873; H10K 59/122; H10K 59/131; H10K 59/38; H10K 59/879;
(Continued)

(56) References Cited

U.S. PATENT DOCUMENTS 12,501,770 B2 * 12/2025 Kim .................. H10K 59/1201
2017/0244066 A1 8/2017 Kamiya et al.
(Continued)

FOREIGN PATENT DOCUMENTS

CN 108198837 A 6/2018
CN 109904212 A 6/2019
(Continued)

OTHER PUBLICATIONS

Extended European search report of counterpart European application No. 22955996.8 issued on Oct. 1, 2025, total 10 pages.

*Primary Examiner* — Eduardo A Rodela
(74) *Attorney, Agent, or Firm* — XSENSUS LLP

(57) ABSTRACT

Provided is a display panel. The display panel includes: a driving backplane, including a base substrate; a light-emitting device on a side of the driving backplane; a package structure on a side, facing away from the driving backplane, of the light-emitting device, wherein the package structure includes an inorganic package structure and an organic package structure, the inorganic package structure being closer to the driving backplane than the organic package
(Continued)

000 structure; and a color stop layer on a side, facing away from the driving backplane, of the organic package structure, wherein the color stop layer is attached to the organic package structure, and in a direction perpendicular to the base substrate, a maximum thickness of the organic package structure is less than a thickness of the inorganic package structure.

19 Claims, 5 Drawing Sheets

(51) Int. Cl.
*H10K 59/131* (2023.01)
*H10K 59/38* (2023.01)

(58) Field of Classification Search
CPC .. H10K 59/8731; H10K 59/771; H10K 59/87; H10K 59/8722; H10D 99/00
See application file for complete search history.

(56) References Cited

U.S. PATENT DOCUMENTS

| | | | | |
|---|---|---|---|---|
| 2020/0280023 | A1* | 9/2020 | Ha | H10K 50/115 |
| 2021/0391398 | A1* | 12/2021 | Ouyang | H10K 59/124 |
| 2022/0077427 | A1* | 3/2022 | Lee | H10K 59/879 |
| 2022/0140290 | A1 | 5/2022 | Choi et al. | |
| 2022/0238845 | A1 | 7/2022 | Sano et al. | |
| 2023/0378402 | A1* | 11/2023 | Yoon | H10K 59/873 |

FOREIGN PATENT DOCUMENTS

| | | | |
|---|---|---|---|
| CN | 111628098 | A | 9/2020 |
| CN | 114447054 | A | 5/2022 |
| CN | 114649351 | A | 6/2022 |
| EP | 3014675 | B1 | 5/2019 |
| EP | 3993082 | A1 | 5/2022 |

* cited by examiner

DISPLAY PANEL AND METHOD FOR MANUFACTURING SAME, AND DISPLAY DEVICE

CROSS-REFERENCE TO RELATED APPLICATION

This application is a U.S. national stage of international application No. PCT/CN2022/114347, filed on Aug. 23, 2022, the disclosure of which is incorporated herein by reference in its entirety.

TECHNICAL FIELD

The present disclosure relates to the field of display technologies, and in particular, relates to a display panel and a method for manufacturing the same, and a display device.

BACKGROUND OF THE INVENTION

Silicon-based organic light-emitting diode (OLED) display panels are novel display panels with a silicon wafer as a base. OLED devices disposed in such display panel has less volume, and thus such display panel has great resolution and is widely applied in near-eye display devices, virtual reality display devices, and augmented reality display devices.

SUMMARY OF THE INVENTION

Embodiments of the present disclosure provide a display panel and a display device. The technical solutions are as follows.

In some embodiments of the present disclosure, a display panel is provided. The display panel includes:

- a driving backplane, including a base substrate;
- a light-emitting device on a side of the driving backplane;
- a package structure on a side, facing away from the driving backplane, of the light-emitting device, wherein the package structure includes an inorganic package structure and an organic package structure, the inorganic package structure being closer to the driving backplane than the organic package structure; and
- a color stop layer on a side, facing away from the driving backplane, of the organic package structure, wherein the color stop layer is attached to the organic package structure, and
- in a direction perpendicular to the base substrate, a maximum thickness of the organic package structure is less than a thickness of the inorganic package structure.

In some embodiments, the inorganic package structure includes: a first inorganic package structure and a second inorganic package structure that are laminated, and a compactness of the second inorganic package structure is greater than a compactness of the first inorganic package structure.

In some embodiments, the first inorganic package structure includes at least two inorganic layers that are laminated.

In some embodiments, materials of the at least two inorganic layers include one or more of silicon nitride and silicon oxynitride.

In some embodiments, the at least two inorganic layers include: a first inorganic layer, a second inorganic layer, a third inorganic layer, and a fourth inorganic layer that are laminated along a direction facing away from the driving backplane, wherein

- both materials of the first inorganic layer and the third inorganic layer include the silicon oxynitride, and both materials of the second inorganic layer and the fourth inorganic layer include the silicon nitride.

In some embodiments, the second inorganic package structure is disposed between two adjacent inorganic layers or between the first inorganic package structure and the organic package structure.

In some embodiments, in the direction perpendicular to the base substrate, a thickness of the second inorganic package structure is less than a thickness of any one of the at least two inorganic layers.

In some embodiments, both the light-emitting device and the color stop layer are disposed in a display region of the display panel, and in the display region, the organic package structure covers the inorganic package structure.

In some embodiments, in the display region, a face, facing away from the driving backplane, of the organic package structure is parallel to the base substrate.

In some embodiments, the display panel includes: a pixel definition layer, a first electrode layer, a light-emitting functional layer, and a second electrode layer, wherein

- the first electrode layer includes a plurality of first electrodes electrically connected to the driving backplane;
- the pixel definition layer includes a plurality of pixel openings in one-to-one correspondence to the plurality of first electrodes, wherein
- portions, in the same pixel opening, of the plurality of first electrodes, the light-emitting functional layer, and the second electrode layer form the light-emitting device.

In some embodiments, in the direction perpendicular to the base substrate, the maximum thickness of the organic package structure is less than a thickness of the light-emitting functional layer.

In some embodiments, the organic package structure includes: a first organic package structure and a second organic package structure, wherein an orthogonal projection of the first organic package structure on the driving backplane is within an orthogonal projection of the first electrode layer on the driving backplane, an overlapped region is present between an orthogonal projection of the second organic package structure on the driving backplane and an orthogonal projection of the pixel definition layer on the base substrate, and

- in the direction perpendicular to the base substrate, a thickness of the first organic package structure is greater than or equal to a thickness of the second organic package structure.

In some embodiments, the orthogonal projection of the first organic package structure on the driving backplane is not overlapped with the orthogonal projection of the pixel definition layer on the base substrate.

In some embodiments, a side face of the first organic package structure is attached to a side face of the second organic package structure, and the first organic package structure and the second organic package structure are disposed on the same layer with the same material.

In some embodiments, a plurality of light-emitting devices are defined in the display panel, and the color stop layer includes a plurality of color stop blocks in one-to-one correspondence to the plurality of light-emitting devices, wherein an overlapped region is present between an orthogonal projection of each of the plurality of color stop blocks on the driving backplane and an orthogonal projection of corresponding light-emitting device on the driving backplane.

In some embodiments, the display panel further includes: a plurality of micro-lenses on a side, facing away from the driving backplane, of the color stop layer, wherein the plurality of micro-lenses are in one-to-one correspondence to the plurality of light-emitting devices, and an overlapped region is present between an orthogonal projection of each of the plurality of micro-lenses on the driving backplane and an orthogonal projection of corresponding light-emitting device on the driving backplane.

In some embodiments, the driving backplane further includes: a plurality of pixel driving circuits on the side of the base substrate that are electrically connected to the plurality of first electrodes in one-to-one correspondence.

In some embodiments of the present disclosure, a method for manufacturing a display panel is provided. The method includes:

- forming a light-emitting device on a side of a driving backplane;
- forming a package structure on a side, facing away from the driving backplane, of the light-emitting device, wherein the package structure includes an inorganic package structure and an organic package structure, the inorganic package structure being closer to the driving backplane than the organic package structure; and
- forming a color stop layer on a side, facing away from the driving backplane, of the organic package structure, wherein the color stop layer is attached to the organic package structure,
- the driving backplane includes a base substrate, and in a direction perpendicular to the base substrate, a maximum thickness of the organic package structure is less than a thickness of the inorganic package structure.

In some embodiments of the present disclosure, a display device is provided. The display device includes: a power supply assembly, and a display panel electrically connected to the power supply assembly, wherein the display panel is the above display panel.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

DETAILED DESCRIPTION OF THE INVENTION

To make the objectives, technical solutions, and advantages of the present disclosure clearer, the embodiments of the present disclosure are further described in detail hereinafter with reference to the accompanying drawings.

As water and oxygen (that is, moisture, oxygen, and other components) from an external environment may corrode the OLED device, and further affect lifetime of the OLED device, the package structure is generally required to package the OLED device, such that the OLED device is separated from the water and oxygen from an external environment, and the lifetime of the OLED device is prolonged.

Figure 1:
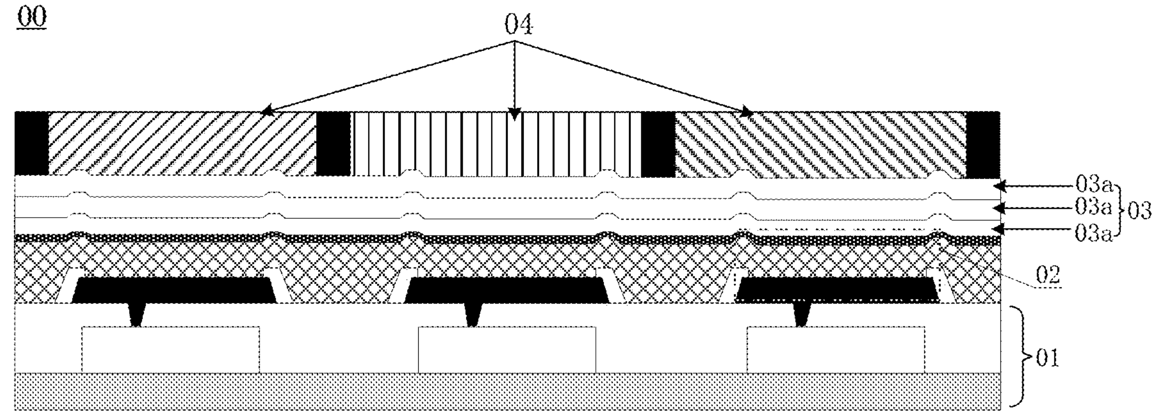
FIG. 1 is a schematic structural diagram of film layers of a silicon-based OLED display panel.

Referring to FIG. 1, FIG. 1 is a schematic structural diagram of film layers of a silicon-based OLED display panel. The silicon-based OLED display panel 00 includes: a driving backplane 01, a plurality of OLED devices 02 on a side of the driving backplane 01, a package structure 03 on a side, facing away from the driving backplane, of the plurality of OLED devices 02, and a color stop layer 04 on a side, facing away from the driving backplane 01, of the package structure 03.

The package structure 03 includes a plurality of laminated inorganic package layers 03*a* coving an outer side of the OLED device 02. The plurality of inorganic package layers 03*a* are configured to separate the water and oxygen from the external environment, such that the water and oxygen from the external environment are prevented from corroding the OLED device 02. And a stress of each inorganic package layer 03*a* is less, such that the inorganic package layers 03*a* does not damage the OLED device 02 in the case that the OLED device 02 is in contact with the inorganic package layers 03*a*.

However, a flatness of each inorganic package layers 03*a* in the package structure 03 is less, such that a flatness of the face, facing away from the driving backplane 01, of the package structure 03 is less, and a flatness of the color stop layer 04 on the side, facing away from the driving backplane 01, of the package structure 03 is less. In the process of exiting the light emitted from the light-emitting device 02 and passing through the color stop layer 04, as the flatness of the color stop layer 04 is less, the light may pass through positions of color stop layer 04 with different thicknesses, and the uniformity of the light emitted from the light-emitting device and exited upon passing through the color stop layer is less. As such, the current package structure 03 may affect the light-emitting effect of the silicon-based OLED display panel 00, and thus the display effect of the silicon-based OLED display panel 00 is poor.

In addition, as the color stop layer 04 on the package structure 03 is formed by the patterning process, and the stress of each inorganic package layers 03*a* is less, a support strength of the inorganic package layers 03*a* in contact with the color stop layer 04 is less. In forming the color stop layer 04 on the side, facing away from the driving backplane 01, of the inorganic package layers 03*a*, the inorganic package layers 03*a* is prone to damage, such that the package structure 03 cannot efficiently package the OLED device 02.

As such, the current package structure 03 may affect the reliability of the silicon-based OLED display panel, and thus the yield of the silicon-based OLED display panel is further less.

Figure 2:
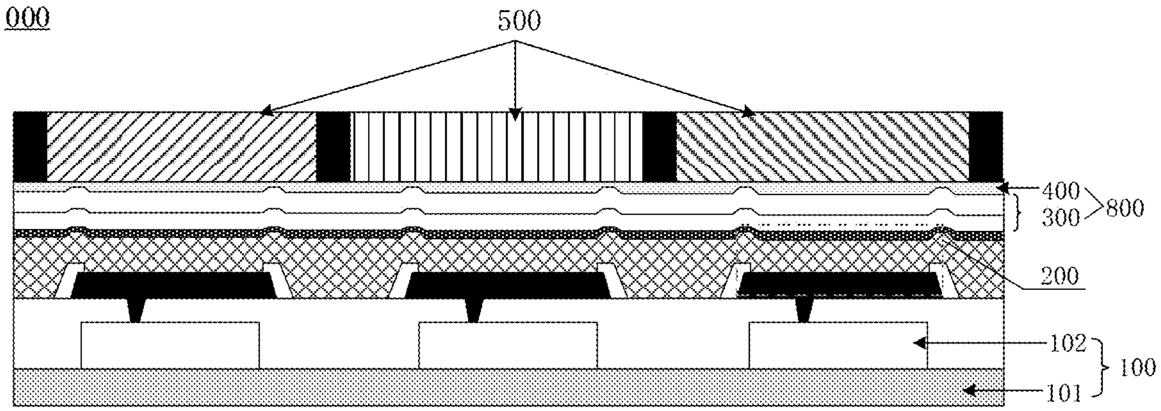
FIG. 2 is a schematic structural diagram of film layers of a display panel according to some embodiments of the present disclosure.

Referring to FIG. 2, FIG. 2 is a schematic structural diagram of film layers of a display panel according to some embodiments of the present disclosure. The display panel 000 includes a driving backplane 100, a light-emitting device 200, a package structure 800, and a color stop layer 500.

The driving backplane 100 in the display panel 000 includes a base substrate 101.

The light-emitting device 200 in the display panel 000 is disposed on a side of the driving backplane 100. The light-emitting device 200 may be an OLED device. Illustratively, a plurality of light-emitting devices 200 are defined in the display panel 000. The driving backplane 100 further includes a plurality of pixel driving circuits 102 on the base substrate 101, and the plurality of pixel driving circuits 102 in the driving backplane 100 are electrically connected to the plurality of light-emitting devices 200 in one-to-one correspondence. As such, the corresponding light-emitting device 200 is driven to emit light by the pixel driving circuit 102, and the display panel displays the corresponding screen.

The package structure 800 in the display panel 000 is disposed on a side, facing away from the driving backplane 100, of the light-emitting device 200, and is configured to package the light-emitting device 200. The package structure 800 includes an inorganic package structure 300 and an organic package structure 400, and the inorganic package structure 300 is closer to the driving backplane 100 than the organic package structure 400.

The color stop layer 500 in the display panel 000 is disposed on a side, facing away from the driving backplane 100, of the organic package structure 400, and is attached to the organic package structure 400.

In a direction perpendicular to the base substrate 101, a maximum thickness of the organic package structure 400 is less than a thickness of the inorganic package structure 300.

The inorganic package structure 300 is made of an inorganic material with great water and oxygen separation property. Thus, the water and oxygen separation for the light-emitting device 200 in the display panel 000 is achieved by the inorganic package structure 300.

The organic package structure 400 is made of an organic material with a great flatness. Thus, the inorganic package structure 300 is flattened by the organic package structure 400, such that a flatness of a face, facing away from the driving backplane 100, of the organic package structure 400 is great. As such, after the color stop layer 500 is disposed on a side, facing away from the driving backplane 100, of the organic package structure 400, a flatness of the color stop layer 500 is great, and a thickness of the color stop layer 500 is uniform. In addition, a uniformity of light emitted from the light-emitting device 200 and exited upon passing through the color stop layer 500 is great, such that the light-emitting effect of the display panel 000 is efficiently improved, and the display effect of the display panel 000 is great.

In addition, the organic package structure 400 made of the organic material has a great support property and great acid and alkali resistance. Subsequently, in forming the color stop layer 500 on the side, facing away from the driving backplane 100, of the organic package structure 400 by the patterning process, a stability of the package structure in the display panel 000 is ensured to be great, and the package structure can efficiently package the light-emitting device 200, such that a reliability of the display panel 000 is efficiently improved, and a yield of the display panel 000 is improved.

In addition, after the inorganic package structure 300 and the organic package structure 400 are formed on the display panel 000, portions, in a non-display region of the display panel 000, of the inorganic package structure 300 and the organic package structure 400 require to be removed to expose a bonding structure in the non-display region of the display panel 000, such that the driving chip can be bonded to the bonding structure by a bonding process subsequently. As it is difficult to remove the portion, in the non-display region, of the organic package structure 400, and it is easy to remove the portion, in the non-display region, of the inorganic package structure 300, the thickness of the organic package structure 400 is ensured to be less in the case that the maximum thickness of the organic package structure 400 is less than the thickness of the inorganic package structure 300, such that the manufacturing difficulty of removing the portion, in the non-display region, of the organic package structure 400 is reduced.

In summary, the display panel in the embodiments of the present disclosure includes: a driving backplane, a light-emitting device, a package structure, and a color stop layer. The package structure includes an inorganic package structure and an organic package structure. The organic package structure is made of organic material with a great flatness. Thus, the inorganic package structure is flattened by the organic package structure, such that a flatness of a face, facing away from the driving backplane, of the organic package structure is great. As such, after the color stop layer is disposed on a side, facing away from the driving backplane, of the organic package structure, a flatness of the color stop layer is great, and a thickness of the color stop layer is uniform. In addition, a uniformity of light emitted from the light-emitting device and exited upon passing through the color stop layer is great, such that the light-emitting effect of the display panel is efficiently improved, and the display effect of the display panel is great. In addition, the organic package structure made of the organic material has a great support property and great acid and alkali resistance. Subsequently, in forming the color stop layer on the side, facing away from the driving backplane, of the organic package structure by a patterning process, a stability of the package structure in the display panel is ensured to be great, and the package structure can efficiently package the light-emitting device, such that a reliability of the display panel is efficiently improved, and a yield of the display panel is improved.

In some embodiments, the component of the organic package structure 400 includes propylene glycol methyl ether acetate, hardening resins, and the like.

It should be noted that the organic package structure 400 in the embodiments of the present disclosure is formed by an inkjet printing process. Prior to forming the organic package structure 400 by the inkjet printing process, the organic materials and a solvent are mixed to form a liquid material, such that the liquid material is fully filled in a recess on the side, facing away from the driving backplane 100, of the inorganic package structure 300 in the process of forming the organic package structure 400 by the inkjet printing process, and then the liquid material is cured to acquire the organic package structure 400 for flattening the inorganic package structure 300. Prior to forming the organic package structure 400 by the inkjet printing process, a curing solvent is added to the liquid material. For example, the curing solvent is a heat curing solvent. In this case, the heat treatment is subsequently performed on the display panel, and thus the liquid material is cured to acquire the organic package structure 400. For example, the curing solvent is a light curing solvent. In this case, ultraviolet treatment is subsequently performed on the display panel, and thus the liquid material is cured to acquire the organic package structure 400.

Figure 3:
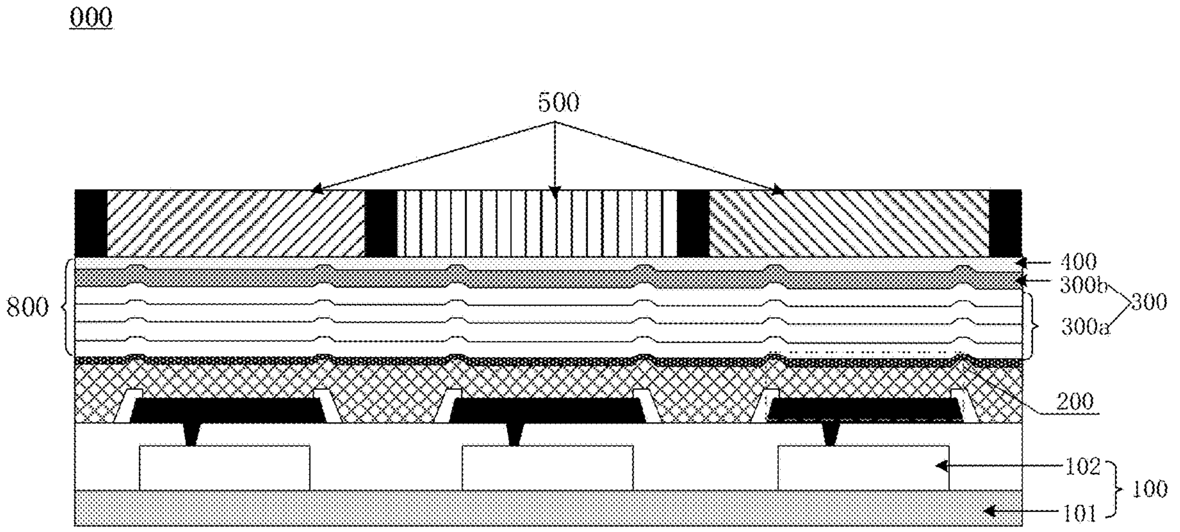
FIG. 3 is a schematic structural diagram of film layers of another display panel according to some embodiments of the present disclosure.

In the embodiments of the present disclosure, referring to FIG. 3, FIG. 3 is a schematic structural diagram of film layers of another display panel according to some embodiments of the present disclosure. The inorganic package structure 300 includes a first inorganic package structure 300*a* and a second inorganic package structure 300*b* that are laminated, and a compactness of the second inorganic package structure 300*b* is greater than a compactness of the first inorganic package structure 300*a*. The laminated first inorganic package structure 300*a* and the second inorganic package structure 300*b* are configured to separate the water and oxygen from the external environment, such that the water and oxygen from the external environment are prevented from corroding the OLED device 02. As the compactness of the second inorganic package structure 300*b* is greater than the compactness of the first inorganic package structure 300*a*, the capacity of the second inorganic package structure 300*b* for separating the water and oxygen is greater than the capacity of the first inorganic package structure 300*a* for separating the water and oxygen, such that the package effect of the inorganic package structure 300 for the light-emitting device 200 is further improved.

In the embodiments of the present disclosure, the first inorganic package structure 300 includes at least two inorganic layers that are laminated, and materials of the at least two inorganic layers include one or more of silicon nitride and silicon oxynitride. On this basis, the composition of the first inorganic package structure 300*a* are described in the following embodiments.

Figure 4:
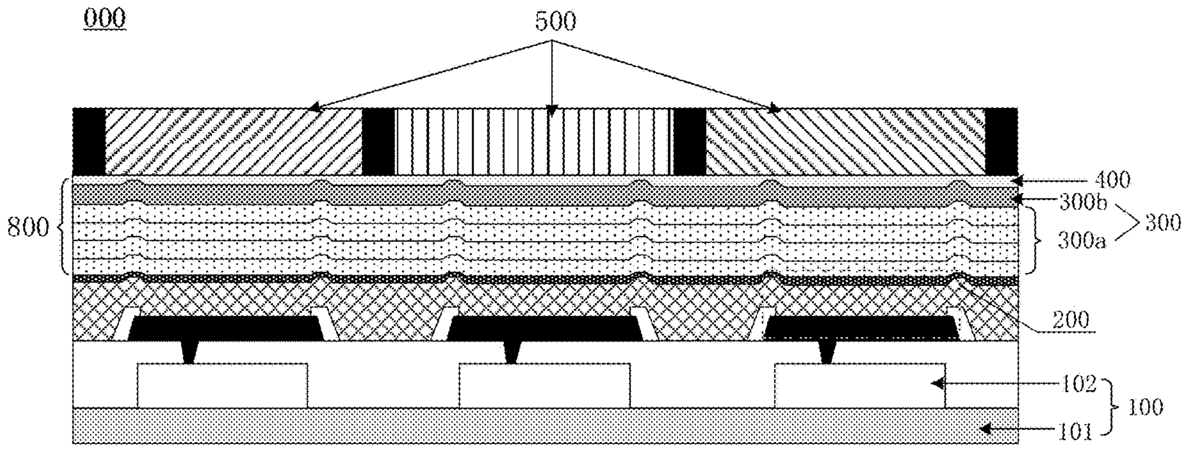
FIG. 4 is a schematic structural diagram of film layers of another display panel according to some embodiments of the present disclosure.

In first embodiments, referring to FIG. 4, FIG. 4 is a schematic structural diagram of film layers of another display panel according to some embodiments of the present disclosure. In the case that the materials of the inorganic layers in the first inorganic package structure 300*a* in the inorganic package structure 300 include silicon nitride, as the capacity of the silicon nitride for separating the water and oxygen is great, the water and oxygen separation of the first inorganic package structure 300*a* for the light-emitting device 200 in the display panel is ensured to be great.

Figure 5:
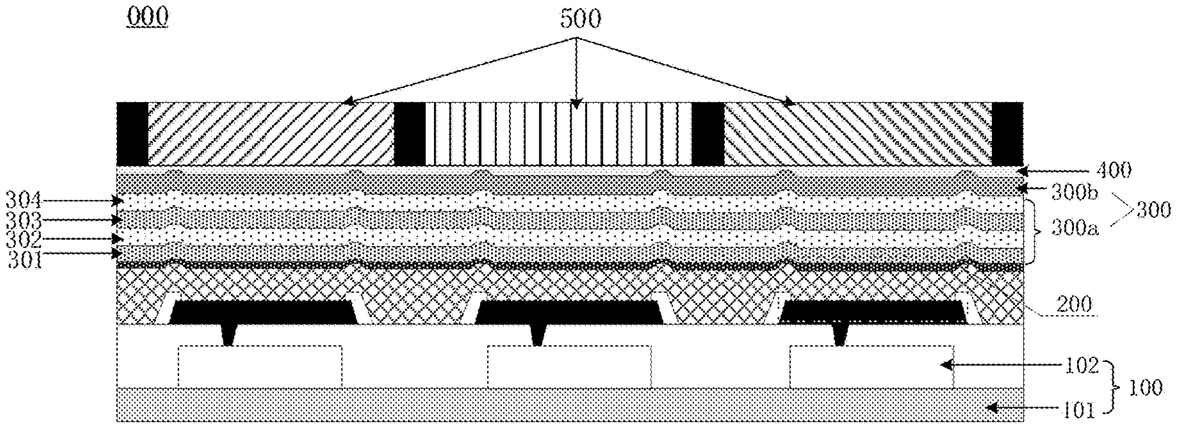
FIG. 5 is a schematic structural diagram of film layers of another display panel according to some embodiments of the present disclosure.

In second embodiments, referring to FIG. 5, FIG. 5 is a schematic structural diagram of film layers of another display panel according to some embodiments of the present disclosure. In the case that the materials of the at least two inorganic layers in the first inorganic package structure 300*a* in the inorganic package structure 300 include silicon nitride and silicon oxynitride, one part of the inorganic layers in the first inorganic package structure 300*a* is made of the silicon nitride, and the other part of the inorganic layers is made of the silicon oxynitride.

As the capacity of the silicon nitride for separating the water and oxygen is great, the first inorganic package structure 300*a* made of the silicon nitride has greater water and oxygen separation for the light-emitting device 200 in the display panel 000. As the silicon oxynitride has a great film adhesion property, the stability of inorganic package structure 300 is ensured by the first inorganic package structure 300*a* made of the silicon oxynitride.

For example, the first inorganic package structure 300*a* in the inorganic package structure 300 includes a first inorganic layer 301, a second inorganic layer 302, a third inorganic layer 303, and a fourth inorganic layer 304 that are laminated along a direction facing away from the driving backplane 100.

Both materials of the first inorganic layer 301 and the third inorganic layer 303 include the silicon oxynitride, and both materials of the second inorganic layer 302 and the fourth inorganic layer 304 include the silicon nitride.

As the light-emitting device 200 in the display panel 000 includes an anode, a light-emitting layer, and a cathode that are laminated, and the cathode of the light-emitting device 200 is closer to the inorganic package structure 300 than the anode, the inorganic package structure 300 is directly attached to the cathode of the light-emitting device 200. In the case that the first inorganic layer 301, closest to the light-emitting device 200, in the inorganic package structure 300 is made of silicon oxynitride, the first inorganic layer 301 is closely attached to the cathode of the light-emitting device 200 as the silicon oxynitride has a great film adhesion property. Thus, a compactness between the first inorganic layer 301 and the light-emitting device 200 is great, and the package effect of the inorganic package structure 300 on the light-emitting device 200 is further improved.

In addition, in the case that the third inorganic layer 303 between the second inorganic layer 302 and the fourth inorganic layer 304 in the inorganic package structure 300 is made of the silicon oxynitride, the compactness between the third inorganic layer 303 and the second inorganic layer 302 is improved by the third inorganic layer 303, and the compactness between the third inorganic layer 303 and the fourth inorganic layer 304 is improved by the third inorganic layer 303, such that the stability of the inorganic package structure 300 is great.

In the case that both the second inorganic layer 302 and the fourth inorganic layer 304 in the inorganic package structure 300 are made of the silicon nitride, as the capacity of the silicon nitride for separating the water and oxygen is great, the water and oxygen separation for the light-emitting device 200 in the display panel 000 is achieved by the second inorganic layer 302 and the fourth inorganic layer 304.

In the embodiments of the present disclosure, the material of the second inorganic package structure 300*b* includes aluminum oxide. As the capacity of aluminum oxide for separating the water and oxygen is great than the capacity of the silicon nitride for separating the water and oxygen and the capacity of the silicon oxynitride for separating the water and oxygen, the package effect of the inorganic package structure 300 on the light-emitting device 200 is further improved in the case that the second inorganic package structure 300*b* in the inorganic package structure 300 is made of aluminum oxide.

In the present disclosure, as the display panel requires to be placed in an environment with higher humidity in forming the second inorganic package structure 300*b* made of the aluminum oxide, an inorganic layer is pre-formed on the side, facing away from the driving backplane 100, of the light-emitting device 200 to prevent the water and oxygen from corroding the light-emitting device 200 in the display panel 000. Thus, the second inorganic package structure 300*b* is disposed between two adjacent first inorganic package structures 300*a* or between the first inorganic package structure 300*a* and the organic package structure 400.

It should be noted that the first inorganic package structure 300*a* in the inorganic package structure 300 in the embodiments of the present disclosure is formed by chemical vapor deposition (CVD), and the second inorganic package structure 300*b* is formed by atomic layer deposition. As a thickness of the film layer formed by the atomic layer deposition is less than a thickness of the film layer formed by the CVD, the thickness of the second inorganic package structure 300*b* is less than the thickness of the first inorganic package structure 300*a* in the direction perpendicular to the base substrate 101. For example, in the direction perpendicular to the base substrate 101, the thickness of the second inorganic package structure 300*b* is less than a thickness of any inorganic layer in the first inorganic package structure 300*a.*

In the embodiments of the present disclosure, the display panel 000 includes a display region. The light-emitting device 200 and the color stop layer 500 in the display panel 000 are disposed in the display region of the display panel 000. In the display region of the display panel 000, the organic package structure 400 covers the inorganic package structure 300. As such, the organic package structure 400 in the display region flats the inorganic package structure 300 in the display region, such that the flatness of the color stop layer 500 in the display region is great.

In some embodiments, in the display region of the display panel 000, a face, facing away from the driving backplane 100, of the organic package structure 400 is parallel to the base substrate 101. As such, after the color stop layer 500 is formed on a face, facing away from the driving backplane 100, of the portion of the organic package structure 400 in the display region, the face, proximal to the organic package structure 400, of the color stop layer 500 is coplanar, and the face, facing away from the organic package structure 400, of the color stop layer 500 is coplanar. In addition, the thicknesses at different positions of the color stop layer 500 are consistent, and the uniformity of the light emitted from the light-emitting device 200 and exiting upon passing through the color stop layer is improved. In some embodiments, the face, facing away from the driving backplane 100, of the organic package structure 400 is not parallel to the base substrate 101, and an included angle between the face, facing away from the driving backplane 100, of the organic package structure 400 and a face, facing towards the light-emitting device 200, of the base substrate 101 is less, for example, ranges from 0° to 10°.

Figure 6:
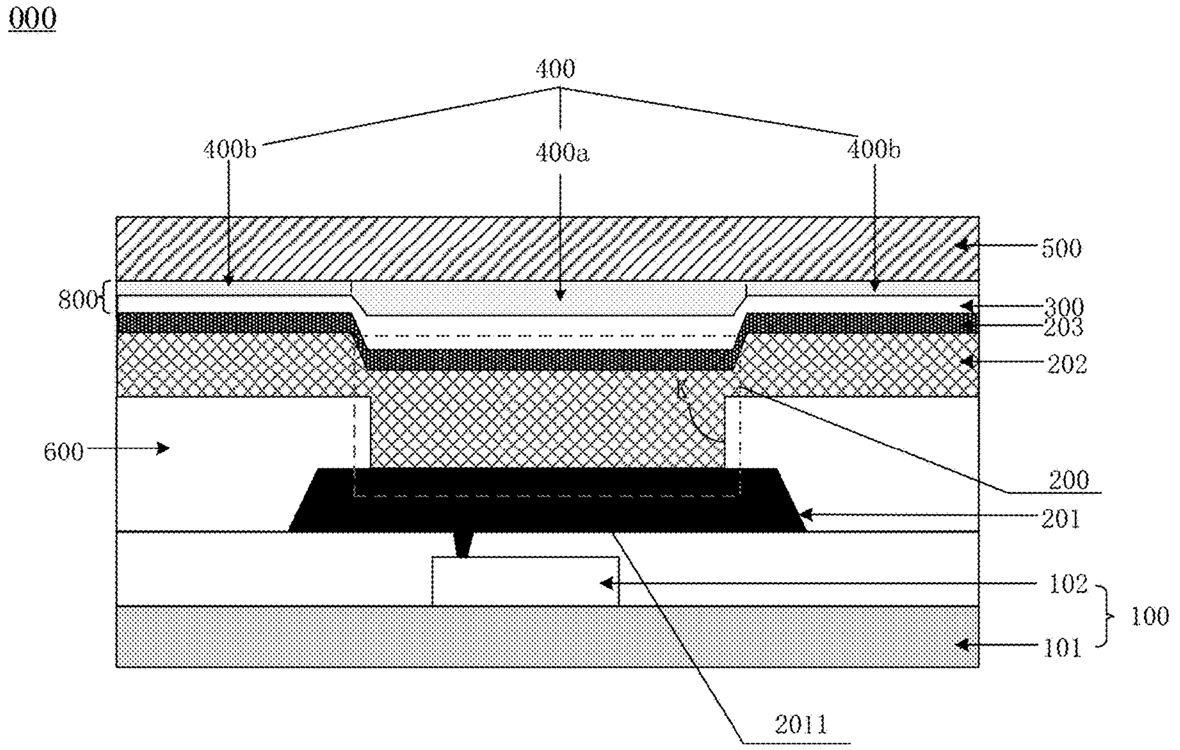
FIG. 6 is a schematic structural diagram of film layers of another display panel according to some embodiments of the present disclosure.

In the embodiments of the present disclosure, referring to FIG. 6, FIG. 6 is a schematic structural diagram of film layers of another display panel according to some embodiments of the present disclosure. The display panel includes a pixel definition layer 600, a first electrode layer 201, a light-emitting functional layer 202, and a second electrode layer 203. The first electrode layer 201 is generally referred to as an anode layer, and the second electrode layer 203 is generally referred to as a cathode layer. The first electrode layer 201 includes a plurality of first electrodes 2011 electrically connected to the driving backplane 100. For example, the plurality of pixel driving circuits 102 in the driving backplane 100 are electrically connected to the plurality of first electrodes 2011 in one-to-one correspondence. The pixel definition layer 600 includes a plurality of pixel openings K in one-to-one correspondence to the plurality of first electrodes 2011.

Portions, in the same pixel opening K, of the plurality of first electrodes 2011, the light-emitting functional layer 202, and the second electrode layer 203 form the light-emitting device 200. The portion, in the same pixel opening K, of the first electrode 2011 is the anode of the light-emitting device 200, and the portion, in the same pixel opening K, of the second electrode layer 203 is the cathode of the light-emitting device 200.

For passing of the light emitted from the light-emitting functional layer 202 in the light-emitting device 200 through the second electrode layer 203, the second electrode layer 203 is made of a conductive material with a transparency, and the first electrode layer 201 is made of a conductive material with a reflectivity. For example, the second electrode layer 203 is made of indium zinc oxide (IZO) or indium tin oxide (ITO), and the first electrode layer 201 is made of a metal material, such as aluminum, titanium, or alloys.

In the embodiments of the present disclosure, in the direction perpendicular to the base substrate 101, the maximum thickness of the organic package structure 400 is less than a thickness of the light-emitting functional layer 202.

In some embodiments, the organic package structure 400 includes a first organic package structure 400*a* and a second organic package structure 400*b*. An orthogonal projection of the first organic package structure 400*a* on the driving backplane 100 is within an orthogonal projection of the first electrode layer 201 on the driving backplane 100, and an overlapped region is present between an orthogonal projection of the second organic package structure 400*b* on the driving backplane 100 and an orthogonal projection of the pixel definition layer 600 on the base substrate 101.

In the present disclosure, the first organic package structure 400*a* in the organic package structure 400 is opposite to the pixel opening K in the pixel definition layer 600, and the second organic package structure 400*b* in the organic package structure 400 is opposite to the pixel definition layer 600. As such, a thickness of the display panel 000 in the region of the pixel opening K in the pixel definition layer 600 is less than thicknesses of other portions of the display panel 000. In the direction perpendicular to the base substrate 101, a thickness of the first organic package structure 400*a* requires to be greater than or equal to a thickness of the second organic package structure 400 to ensure that the face, facing away from the backplane 100, of the organic package structure 400 is parallel to the base substrate 101.

In some embodiments, the orthogonal projection of the first organic package structure 400*a* on the driving backplane 100 is not overlapped with the orthogonal projection of the pixel definition layer 600 on the base substrate, such that the first organic package structure 400*a* is ensured to be opposite to the pixel opening K in the pixel definition layer 600. That is, the orthogonal projection of the first organic package structure 400*a* on the driving backplane 100 is within an orthogonal projection of the pixel opening K on the driving backplane 100.

In the present disclosure, a side face of the first organic package structure 400*a* is attached to a side face of the second organic package structure 400*b*, and the first organic package structure 400*a* and the second organic package structure 400*b* are disposed on the same layer with the same material. That is, the first organic package structure 400*a* and the second organic package structure 400*b* in the organic package structure 400 are of an integrated structure, and are simultaneously formed by the one process.

Figure 7:
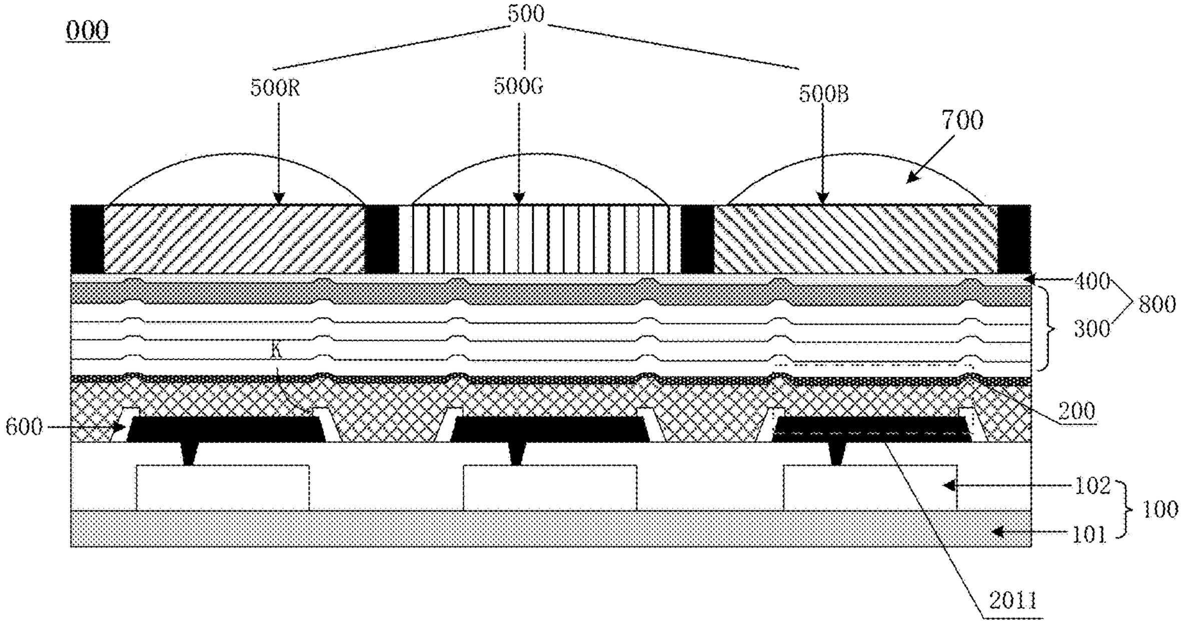
FIG. 7 is a schematic structural diagram of film layers of another display panel according to some embodiments of the present disclosure.

In the embodiments of the present disclosure, referring to FIG. 7, FIG. 7 is a schematic structural diagram of film layers of another display panel according to some embodiments of the present disclosure. A plurality of light-emitting devices 200 are defined in the display panel 000, and the color stop layer 500 includes a plurality of color stop blocks in one-to-one correspondence to the plurality of light-emitting devices 200. An overlapped region is present between an orthogonal projection of each of the plurality of color stop blocks on the driving backplane 100 and an orthogonal projection of corresponding light-emitting device 200 on the driving backplane 100.

In some embodiments, the color stop layer 500 includes the color stop blocks of three colors, that is, a red stop block 500R, a green stop block 500G, and a blue stop block 500B. As such, light emitted from the light-emitting device 200 corresponding to the red stop block 500R emits red light upon passing through the color stop layer 500, light emitted from the light-emitting device 200 corresponding to the green stop block 500G emits green light upon passing through the color stop layer 500, and light emitted from the light-emitting device 200 corresponding to the blue stop block 500B emits blue light upon passing through the color stop layer 500. As such, by the color stop layer 500 disposed in the display panel 000, the display panel 000 can emit the red light, the green light, and the blue light simultaneously, such that the display panel 000 can display the color screen.

In the embodiments of the present disclosure, referring to FIG. 7, FIG. 7 is a schematic structural diagram of film layers of another display panel according to some embodiments of the present disclosure. The display panel 000 further includes a plurality of micro-lenses 700 on a side, facing away from the driving backplane 100, of the color stop layer 500. The plurality of micro-lenses 700 are in one-to-one correspondence to the plurality of light-emitting devices 200, and an overlapped region is present between an orthogonal projection of each of the plurality of micro-lenses 700 on the driving backplane 100 and an orthogonal projection of corresponding light-emitting device 200 on the driving backplane 100. Light emitted from the corresponding light-emitting device 200 is converged by the micro-lens 700, such that the light exiting effect of the light emitted from the light-emitting device 200 is improved, and the display effect of the display panel 000 is great.

Figure 8:
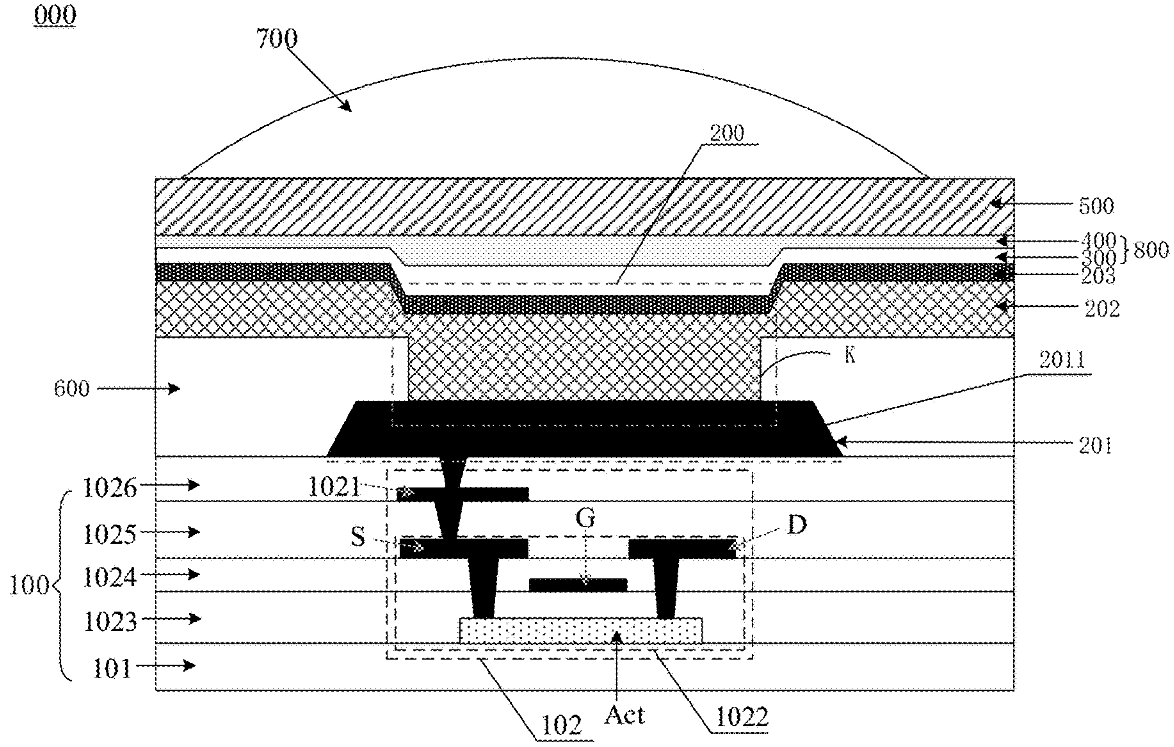
FIG. 8 is a schematic structural diagram of film layers of another display panel according to some embodiments of the present disclosure.

Referring to FIG. 8, FIG. 8 is a schematic structural diagram of film layers of another display panel according to some embodiments of the present disclosure. The pixel driving circuit 102 in the driving backplane 100 further includes a connection electrode 1021 and a thin-film transistor 1022. The connection electrode 1021 is disposed on a side, facing away from the base substrate 101, of the thin-film transistor 1022. The light-emitting device 200 in the display panel 000 is disposed on a side, facing away from the base substrate 101, of the connection electrode 1021. It should be noted that a plurality of thin-film transistors 1022 are generally defined in the pixel driving circuit 102.

The thin-film transistor 1022 includes a source S, a drain D, a gate G, and an active layer Act. The source S and the drain D of the thin-film transistor 1022 are electrically connected to the active layer Act, and the gate G of the thin-film transistor 1022 is insulated from the active layer Act. For example, the gate G of the thin-film transistor 1022 is insulated from the active layer Act by a gate insulation layer. One of the source S and the drain D is electrically connected to the anode in the corresponding light-emitting device 200 by the connection electrode 1021.

In the present disclosure, the source S and the drain D of the thin-film transistor 1022 are disposed on the same layer with the same material. The thin-film transistor 1022 is a top-gate transistor. That is, the active layer Act of the thin-film transistor 1022 is closer to the base substrate 101 than the gate G.

In this case, the active layer Act of the thin-film transistor 1022 is disposed on the base substrate 101, the gate G of the thin-film transistor 1022 is disposed on a side, facing away from the base substrate 101, of the active layer Act, and the source S and the drain D of the thin-film transistor 1022 are disposed on a side, facing away from the base substrate 101, of the gate G.

In addition, an insulation layer is present between a conduction layer of the source S and the drain D of the thin-film transistor 1022 and a conduction layer of the gate G. For example, the insulation layer is an inter-layer dielectric layer. It should be noted that the thin-film transistor 1022 is a bottom-gate transistor in some embodiments, which is not limited in the embodiments of the present disclosure.

In the present disclosure, a first planarization layer 1025 is disposed between the conduction layer of the source and the drain of the thin-film transistor 1022 and a conduction layer of the connection electrode 1021, and a second planarization layer 1026 is disposed between the conduction layer of the connection electrode 1021 and the anode layer 201. The flatness of the conduction layer of the connection electrode 1021 is improved by the first planarization layer 1025, such that a capacity of transmitting signals of signal lines disposed in the conduction layer of the connection electrode 1021 is great. The flatness of the subsequently formed light-emitting device 200 is improved by the second planarization layer 1026, such that the light-emitting device 200 may stably emits light.

In summary, the display panel in the embodiments of the present disclosure includes: a driving backplane, a light-emitting device, a package structure, and a color stop layer. The package structure includes an inorganic package structure and an organic package structure. The organic package structure is made of organic material with a great flatness. Thus, the inorganic package structure is flattened by the organic package structure, such that a flatness of a face, facing away from the driving backplane, of the organic package structure is great. As such, after the color stop layer is disposed on a side, facing away from the driving backplane, of the organic package structure, a flatness of the color stop layer is great, and a thickness of the color stop layer is uniform. In addition, a uniformity of light emitted from the light-emitting device and exited upon passing through the color stop layer is great, such that the light-emitting effect of the display panel is efficiently improved, and the display effect of the display panel is great. In addition, the organic package structure made of the organic material has a great support property and great acid and alkali resistance. Subsequently, in forming the color stop layer on the side, facing away from the driving backplane, of the organic package structure by a patterning process, a stability of the package structure in the display panel is ensured to be great, and the package structure can efficiently package the light-emitting device, such that a reliability of the display panel is efficiently improved, and a yield of the display panel is improved.

Figure 9:
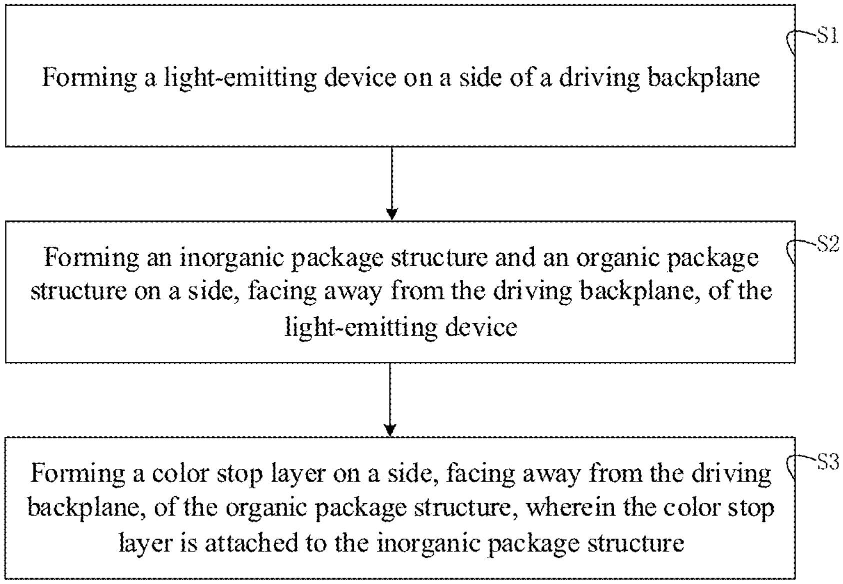
FIG. 9 is a flow chart of a method for manufacturing a display panel according to some embodiments of the present disclosure.

In the embodiments of the present disclosure, referring to FIG. 9, FIG. 9 is a flow chart of a method for manufacturing a display panel according to some embodiments of the present disclosure. The method includes the following processes.

In S1, a light-emitting device is formed on a side of a driving backplane.

In S2, a package structure is formed on a side, facing away from the driving backplane, of the light-emitting device, wherein the package structure includes an inorganic package structure and an organic package structure, the inorganic package structure being closer to the driving backplane than the organic package structure In S3, a color stop layer is formed on a side, facing away from the driving backplane, of the organic package structure, wherein the color stop layer is attached to the organic package structure.

The driving backplane includes a base substrate, and in a direction perpendicular to the base substrate, a maximum thickness of the organic package structure is less than a thickness of the inorganic package structure.

For the convenience and simplicity of the description, those skilled in the art can clearly understand that the specific principle of the above method for manufacturing the display panel can refer to the corresponding content in the embodiments of the structure of the above display panel, which is not repeated herein.

In summary, the method for manufacturing the display panel in the embodiments of the present disclosure includes: forming a plurality of light-emitting devices, a package structure, and a color stop layer on the driving backplane. The package structure includes an inorganic package structure and an organic package structure. The organic package structure is made of organic material with a great flatness. Thus, the inorganic package structure is flattened by the organic package structure, such that a flatness of a face, facing away from the driving backplane, of the organic package structure is great. As such, after the color stop layer is disposed on a side, facing away from the driving backplane, of the organic package structure, a flatness of the color stop layer is great, and a thickness of the color stop layer is uniform. In addition, a uniformity of light emitted from the light-emitting device and exited upon passing through the color stop layer is great, such that the light-emitting effect of the display panel is efficiently improved, and the display effect of the display panel is great. In addition, the organic package structure made of the organic material has a great support property and great acid and alkali resistance. Subsequently, in forming the color stop layer on the side, facing away from the driving backplane, of the organic package structure by a patterning process, a stability of the package structure in the display panel is ensured to be great, and the package structure can efficiently package the light-emitting device, such that a reliability of the display panel is efficiently improved, and a yield of the display panel is improved.

The embodiments of the present disclosure further provide a display device. The display device is a product or a component with a display function, such as a mobile phone, a tablet computer, a television, a display, a notebook computer, a digital photo frame, or a navigator, or wearable display device, such as near-eye display devices, virtual reality display devices, and augmented reality display devices. The display device includes a power supply assembly and a display panel. In the embodiments of the present disclosure, the display panel is the display panel in the above embodiments. For example, the display panel is the display panel as shown in FIG. 2, FIG. 3, FIG. 4, FIG. 5, FIG. 6, FIG. 7, or FIG. 8. The power supply assembly is connected to the display panel and is configured to supply power to the display panel, such that the display panel displays the screen.

It should be noted that in the accompanying drawings, for clarity of the illustration, the dimension of the layers and regions may be scaled up. It should be understood that when an element or layer is described as being "on" another element or layer, the described element or layer may be directly located on other elements or layers, or an intermediate layer may exist. In addition, it should be understood that when an element or layer is described as being "under" another element or layer, the described element or layer may be directly located under other elements, or more than one intermediate layer or element may exist. In addition, it should be further understood that when a layer or element is described as being arranged "between" two layers or elements, the described layer or element may be the only layer between the two layers or elements, or more than one intermediate layer or element may exist. In the whole disclosure, like reference numerals indicate like elements.

it should be noted that, the terms "first," "second," "third" and the like are only used for the purpose of description and should not be construed as indicating or implying relative importance or implicitly indicating the number of technical features as indicated. Unless otherwise clearly defined, the expression "a plurality of" refers to two or more.

Described above are merely exemplary embodiments of the present disclosure, and are not intended to limit the present disclosure. Any modifications, equivalent replacements, improvements and the like made within the spirit and principles of the present disclosure should be encompassed within the scope of protection of the present disclosure.

The invention claimed is:

1. A display panel, comprising:

a driving backplane, comprising a base substrate;

a light-emitting device on a side of the driving backplane;

a package structure on a side, facing away from the driving backplane, of the light-emitting device, wherein the package structure comprises an inorganic package structure and an organic package structure, the inorganic package structure being closer to the driving backplane than the organic package structure, and the inorganic package structure comprises: a first inorganic package structure and a second inorganic package structure that are laminated, and a compactness of the second inorganic package structure is greater than a compactness of the first inorganic package structure; and a color stop layer on a side, facing away from the driving backplane, of the organic package structure, wherein the color stop layer is attached to the organic package structure, and in a direction perpendicular to the base substrate, a maximum thickness of the organic package structure is less than a thickness of the inorganic package structure.

2. The display panel according to claim 1, wherein the first inorganic package structure comprises at least two inorganic layers that are laminated.

3. The display panel according to claim 2, wherein materials of the at least two inorganic layers comprise one or more of silicon nitride and silicon oxynitride.

4. The display panel according to claim 3, wherein the at least two inorganic layers comprise: a first inorganic layer, a second inorganic layer, a third inorganic layer, and a fourth inorganic layer that are laminated along a direction facing away from the driving backplane, wherein both materials of the first inorganic layer and the third inorganic layer comprise the silicon oxynitride, and both materials of the second inorganic layer and the fourth inorganic layer comprise the silicon nitride.

5. The display panel according to claim 3, wherein a material of the second inorganic package structure comprises aluminum oxide.

6. The display panel according to claim 2, wherein the second inorganic package structure is disposed between two adjacent inorganic layers or between the first inorganic package structure and the organic package structure.

7. The display panel according to claim 2, wherein in the direction perpendicular to the base substrate, a thickness of the second inorganic package structure is less than a thickness of any one of the at least two inorganic layers.

8. The display panel according to claim 1, wherein both the light-emitting device and the color stop layer are disposed in a display region of the display panel, and in the display region, the organic package structure covers the inorganic package structure.

9. The display panel according to claim 8, wherein in the display region, a face, facing away from the driving backplane, of the organic package structure is parallel to the base substrate.

10. The display panel according to claim 1, further comprising: a pixel definition layer, a first electrode layer, a light-emitting functional layer, and a second electrode layer; wherein

- the first electrode layer comprises a plurality of first electrodes electrically connected to the driving backplane; and
- the pixel definition layer comprises a plurality of pixel openings in one-to-one correspondence to the plurality of first electrodes, wherein portions, in the same pixel opening, of the plurality of first electrodes, the light-emitting functional layer, and the second electrode layer form the light-emitting device.

11. The display panel according to claim 10, wherein in the direction perpendicular to the base substrate, the maximum thickness of the organic package structure is less than a thickness of the light-emitting functional layer.

12. The display panel according to claim 11, wherein a plurality of light-emitting devices are defined in the display panel, and the color stop layer comprises a plurality of color stop blocks in one-to-one correspondence to the plurality of light-emitting devices, wherein an overlapped region is present between an orthogonal projection of each of the plurality of color stop blocks on the driving backplane and an orthogonal projection of corresponding light-emitting device on the driving backplane.

13. The display panel according to claim 12, further comprising: a plurality of micro-lenses on a side, facing away from the driving backplane, of the color stop layer, wherein the plurality of micro-lenses are in one-to-one correspondence to the plurality of light-emitting devices, and an overlapped region is present between an orthogonal projection of each of the plurality of micro-lenses on the driving backplane and an orthogonal projection of corresponding light-emitting device on the driving backplane.

14. The display panel according to claim 11, wherein the driving backplane further comprises: a plurality of pixel driving circuits on the side of the base substrate that are electrically connected to the plurality of first electrodes in one-to-one correspondence.

15. The display panel according to claim 10, wherein the organic package structure comprises: a first organic package structure and a second organic package structure, wherein an orthogonal projection of the first organic package structure on the driving backplane is within an orthogonal projection of the first electrode layer on the driving backplane, an overlapped region is present between an orthogonal projection of the second organic package structure on the driving backplane and an orthogonal projection of the pixel definition layer on the base substrate, and in the direction perpendicular to the base substrate, a thickness of the first organic package structure is greater than or equal to a thickness of the second organic package structure.

16. The display panel according to claim 15, wherein the orthogonal projection of the first organic package structure on the driving backplane is not overlapped with the orthogonal projection of the pixel definition layer on the base substrate.

17. The display panel according to claim 15, wherein a side face of the first organic package structure is attached to a side face of the second organic package structure, and the first organic package structure and the second organic package structure are disposed on the same layer with the same material.

18. A method for manufacturing a display panel, comprising:

- forming a light-emitting device on a side of a driving backplane;
- forming a package structure on a side, facing away from the driving backplane, of the light-emitting device, wherein the package structure comprises an inorganic package structure and an organic package structure, the inorganic package structure being closer to the driving backplane than the organic package structure, and the inorganic package structure comprises: a first inorganic package structure and a second inorganic package structure that are laminated, and a compactness of the second inorganic package structure is greater than a compactness of the first inorganic package structure; and
- forming a color stop layer on a side, facing away from the driving backplane, of the organic package structure, wherein the color stop layer is attached to the organic package structure, the driving backplane comprises a base substrate, and in a direction perpendicular to the base substrate, a maximum thickness of the organic package structure is less than a thickness of the inorganic package structure.

19. A display device, comprising: a power supply assembly, and a display panel electrically connected to the power supply assembly, wherein the display panel comprises:

- a driving backplane, comprising a base substrate;
- a light-emitting device on a side of the driving backplane;
- a package structure on a side, facing away from the driving backplane, of the light-emitting device, wherein the package structure comprises an inorganic package structure and an organic package structure, the inorganic package structure being closer to the driving backplane than the organic package structure, and the inorganic package structure comprises: a first inorganic package structure and a second inorganic package structure that are laminated, and a compactness of the second inorganic package structure is greater than a compactness of the first inorganic package structure; and
- a color stop layer on a side, facing away from the driving backplane, of the organic package structure, wherein the color stop layer is attached to the organic package structure, and in a direction perpendicular to the base substrate, a maximum thickness of the organic package structure is less than a thickness of the inorganic package structure.

* * * * *